US012635173B2

(12) United States Patent
King et al.

(10) Patent No.: US 12,635,173 B2
(45) Date of Patent: May 19, 2026

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Ya-Chin King, Hsinchu (TW); Chrong Jung Lin, Hsinchu (TW); Burn Jeng Lin, Hsinchu (TW); Yao-Hung Huang, Hsinchu (TW); Wei Chang, New Taipei (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 427 days.

(21) Appl. No.: 18/328,037

(22) Filed: Jun. 2, 2023

(65) Prior Publication Data

US 2024/0405087 A1     Dec. 5, 2024

(51) Int. Cl.
*H10D 30/68* (2025.01)
*H10D 30/01* (2025.01)
(Continued)

(52) U.S. Cl.
CPC ....... *H10D 30/6219* (2025.01); *H10D 30/024* (2025.01); *H10D 30/6211* (2025.01);
(Continued)

(58) Field of Classification Search
CPC ............. H10D 30/024; H10D 30/6211; H10D 30/6891; H10D 84/0158; H10D 84/834;
(Continued)

(56) References Cited

U.S. PATENT DOCUMENTS

| | | | |
|---|---|---|---|
| 11,335,609 B2 * | 5/2022 | Lin | ......................... H01L 22/14 |
| 2023/0128236 A1 | 4/2023 | Baik | |
| 2023/0231061 A1 * | 7/2023 | Hossain | .................. H10F 77/60 |
| | | | 257/435 |

FOREIGN PATENT DOCUMENTS

| | | |
|---|---|---|
| CN | 105047749 A | 11/2015 |
| TW | 201530841 A | 8/2015 |
| TW | 202324781 A | 6/2023 |

OTHER PUBLICATIONS

Furtado et al., "Active ISFET Sensor Readout Circuit", 2017 2nd International Symposium on Instrumentation Systems Circuits and Transducers (INSCIT), 2017, p. 1-5.

* cited by examiner

*Primary Examiner* — Ajay Ojha
*Assistant Examiner* — Sandra Milena Rodriguez Villanu
(74) *Attorney, Agent, or Firm* — Birch, Stewart, Kolasch & Birch, LLP

(57) ABSTRACT

A semiconductor device includes a sensing element including a sensing electrode and a filter covering the sensing electrode. The filter includes a first work function layer and a second work function layer. The first work function layer is over the sensing electrode. The second work function layer is over the first work function layer. A work function value of the second work function layer is greater than a work function value of the first work function layer, and an atomic percentage of metal in the second work function layer is greater than an atomic percentage of metal in the first work function layer.

20 Claims, 15 Drawing Sheets

(51) Int. Cl.

| | |
|---|---|
| *H10D 30/62* | (2025.01) |
| *H10D 62/84* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 30/6891* (2025.01); *H10D 62/84* (2025.01); *H10D 64/017* (2025.01); *H10D 84/0149* (2025.01); *H10D 84/0151* (2025.01); *H10D 84/0158* (2025.01); *H10D 84/038* (2025.01); *H10D 84/834* (2025.01)

(58) Field of Classification Search
CPC ....... H10D 30/43; H10F 77/413; H10F 77/40; H10F 39/10; H10K 30/87
See application file for complete search history.

SEMICONDUCTOR DEVICE AND MANUFACTURING METHOD THEREOF

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the size has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects. However, the current and systems for patterning material layers in semiconductor wafers has not been entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
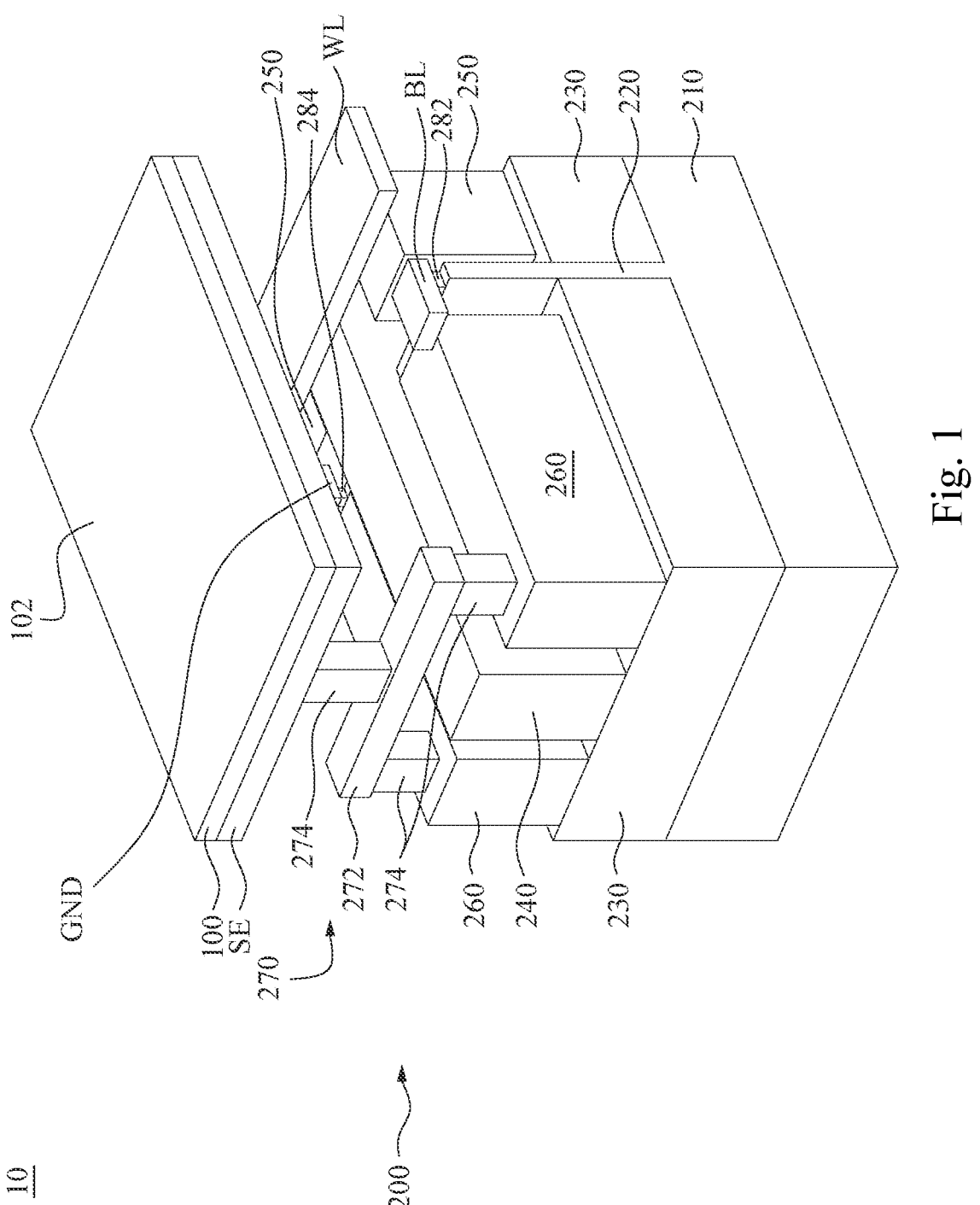
FIG. 1 is a diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The present disclosure is related to semiconductor devices and methods of forming the same. More particularly, some embodiments of the present disclosure are related to semiconductor devices with a signal filter on a sensing electrode of the semiconductor devices. In some embodiments, the semiconductor devices may be realized on the device including planar devices, multi-gate devices, FinFETs, nanosheet-gate FETs, and gate-all-around FETs.

FIG. 1 is a diagram of a semiconductor device 10 in accordance with some embodiments. The semiconductor device 10 includes a sensing element 200 and a filter 100. The sensing element 200 includes a sensing electrode SE, and the filter 100 covers the sensing electrode SE. The sensing electrode SE is configured to receive a signal. The filter 100 is configured to filter (or rectify) the signal. For example, the filter 100 filters positive carriers of the signal and allows negative carriers of the signal to pass through to the sensing electrode SE, or vice versa. As such, the effect of positive and negative charging can be differentiated.

Figure 10A:
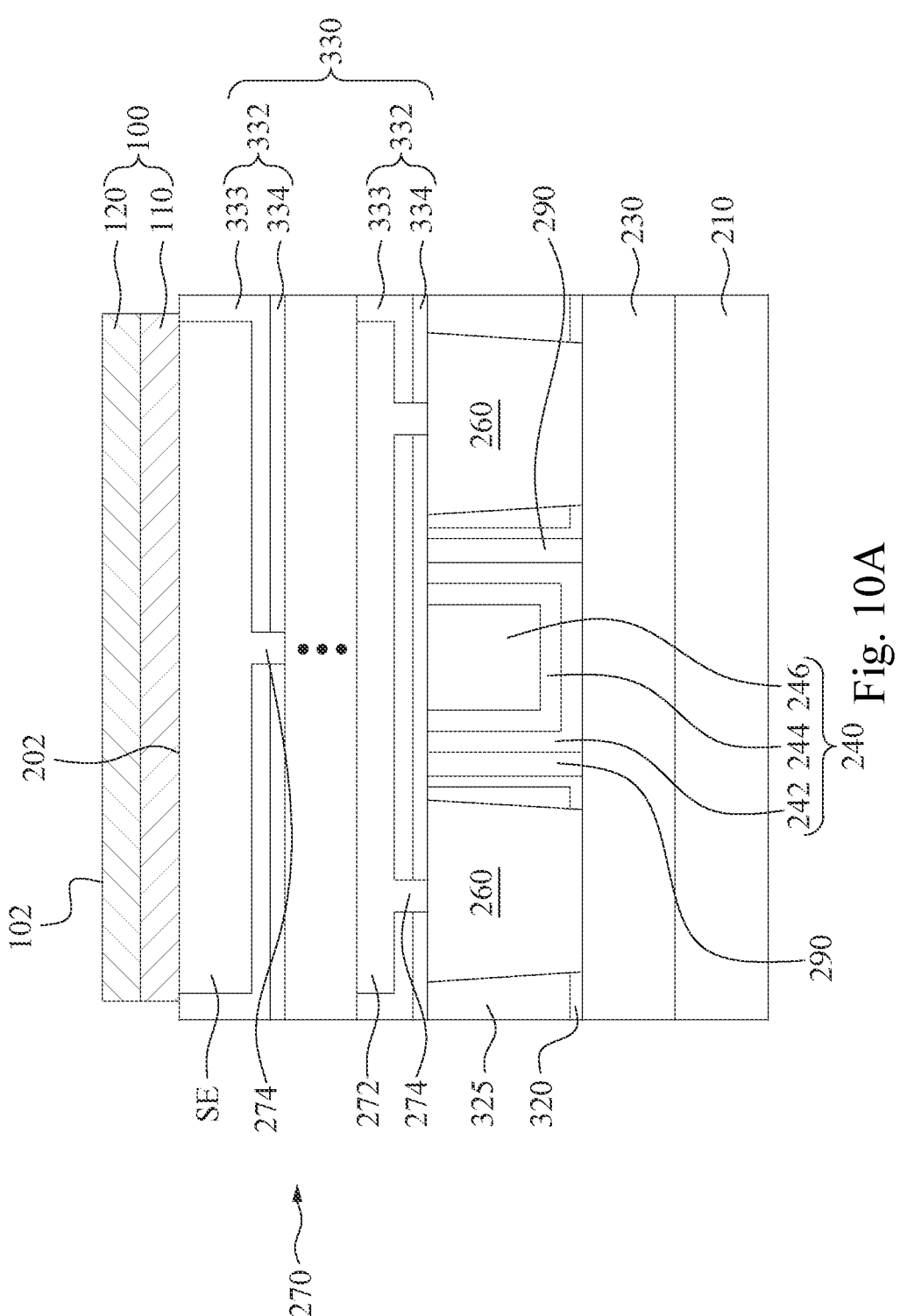
Figure 10B:
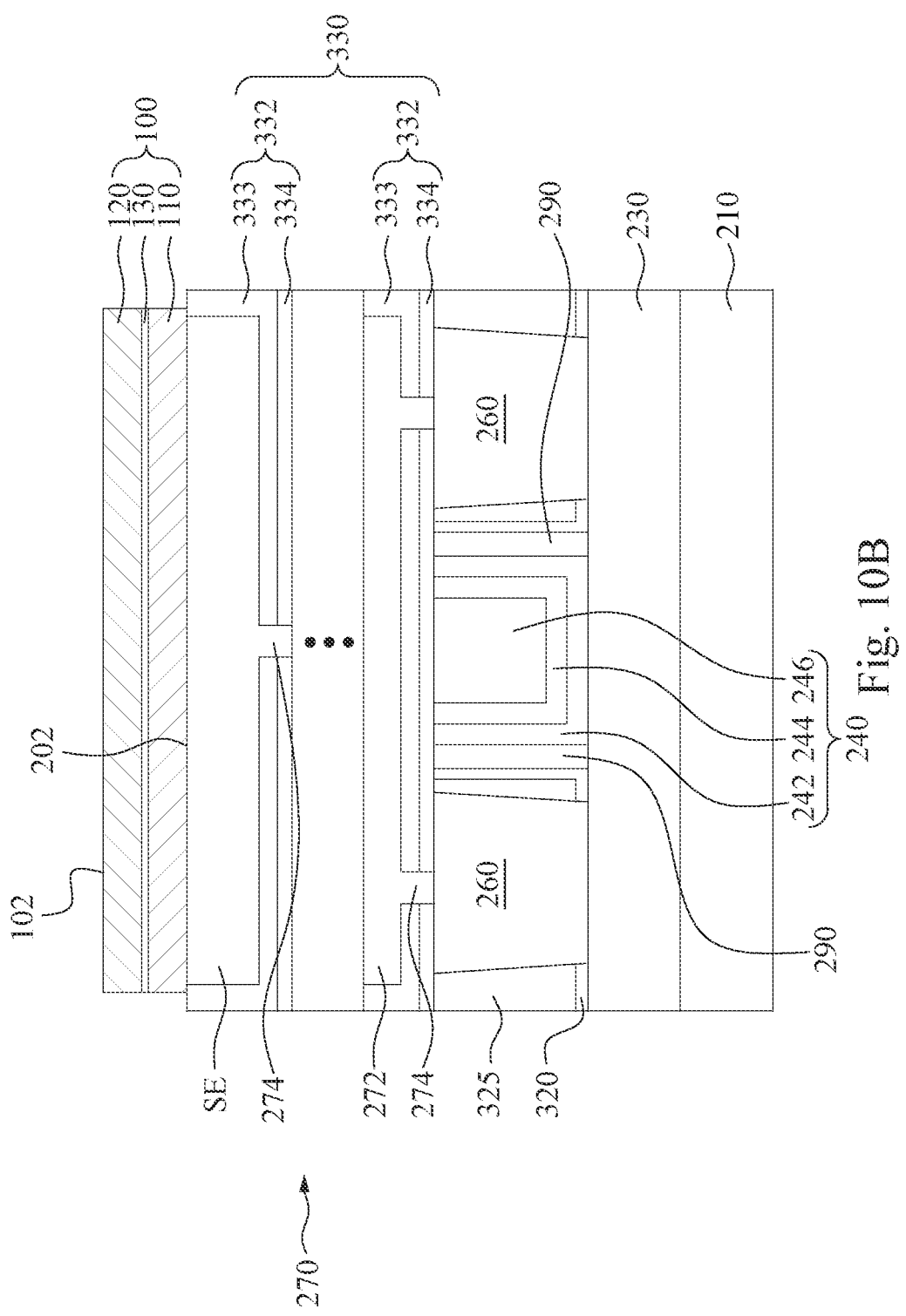

In some embodiments, the semiconductor device 10 may be an EUV radiation detector. An EUV radiation source may utilize a mechanism of laser-produced plasma (LPP) to generate the EUV radiation. Therefore, when the semiconductor device 10 detects the intensity of the EUV radiation, the plasma (i.e., background signal) may be also sensed and thus decrease the accuracy of the sensing element 200. Therefore, the filter 100 is formed over the sensing electrode SE to filter the background signal. In some embodiments, the filter 100 completely covers the sensing electrode SE. That is, an area of a top surface 102 of the filter 100 is equal to (as shown in FIG. 1) or greater than (as shown in FIGS. 10A and 10B) an area of a top surface 202 of the sensing electrode SE. Further, there is no conductive via between the filter 100 and the sensing electrode SE.

Figures 2A, 2B, 3A, 3B:
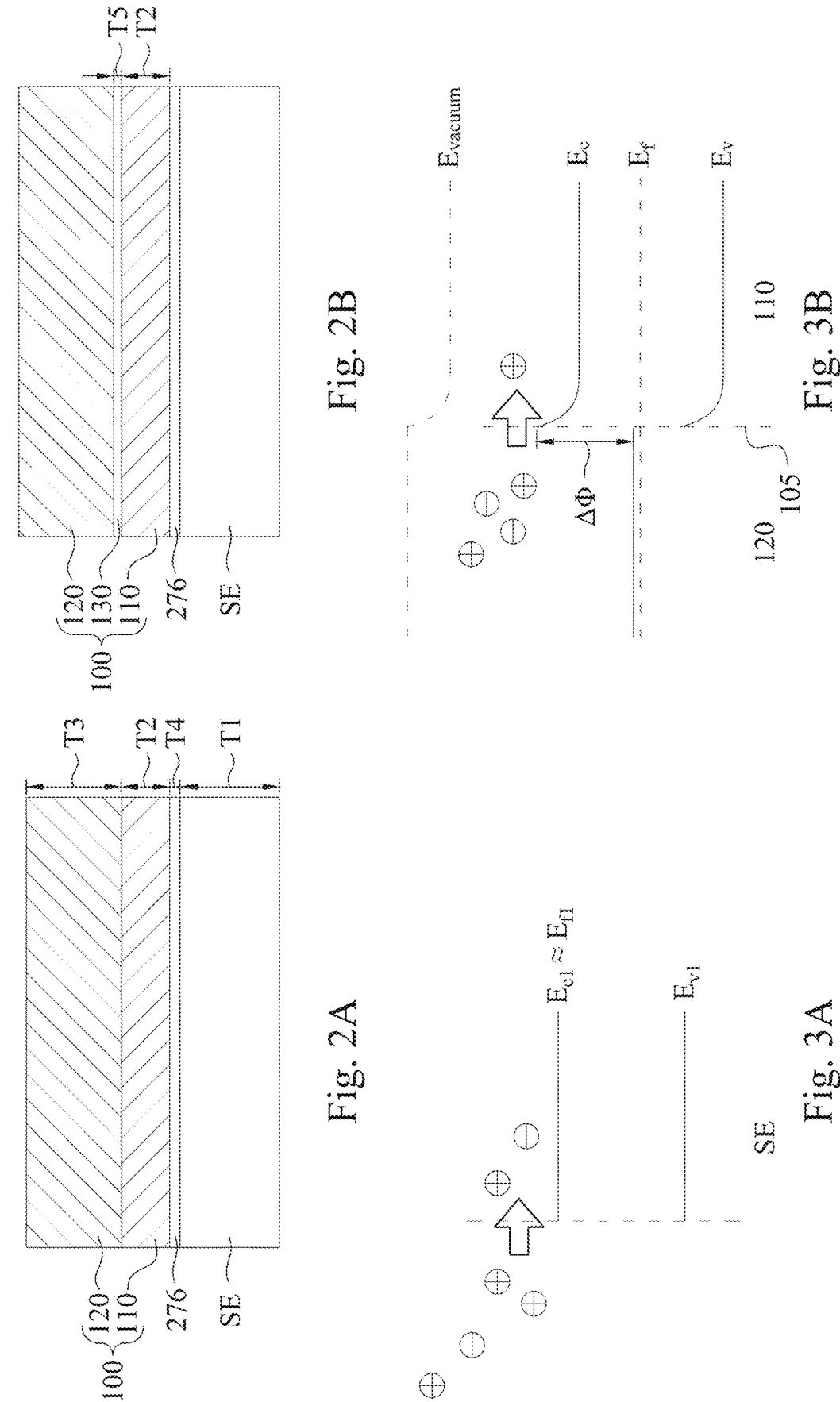
FIG. 2A is a cross-sectional view of the sensing electrode and the filter in FIG. 1 according to some embodiments.
FIG. 2B is a cross-sectional view of the sensing electrode and the filter in FIG. 1 according to still some embodiments.
FIG. 3A is a band diagram of the sensing electrode according to some embodiments.
FIG. 3B is a band diagram of the first work function layer and the second work function layer according to some embodiments.

FIG. 2A is a cross-sectional view of the sensing electrode SE and the filter 100 in FIG. 1 according to some embodiments. The filter 100 is formed over the sensing electrode SE. In some embodiments, the filter 100 includes a first work function layer 110 and a second work function layer 120 over the first work function layer 110. For example, the first work function layer 110 is in contact with the second work function layer 120. The first work function layer 110 has a work function value lower than that of the second work function layer 120, such that a barrier height $\Delta\Phi$ (see FIG. 3B) is formed between the first work function layer 110 and the second work function layer 120.

FIG. 3A is a band diagram of the sensing electrode SE according to some embodiments, wherein $E_{c1}$ is referred to as a conductive band of the sensing electrode SE, $E_{f1}$ is referred to as the fermi level, and $E_{v1}$ is referred to as a valence band, and FIG. 3B is a band diagram of the first work function layer 110 and the second work function layer 120 according to some embodiments, wherein $E_{vacuum}$ is referred to as the vacuum level, $E_c$ is referred to as a conductive band of the second work function layer 120, Ef is referred to as a conductive band of the first word function layer 110, and Ev is referred to as a valence band. As shown in FIG. 3A, since the sensing electrode SE is conductive, the conductive band $E_{c1}$ of the sensing electrode SE is substantially level with the fermi level $E_{f1}$ of the sensing electrode SE. Therefore, carriers of the signal (both positive and negative carriers) are able to pass through the sensing electrode SE. On the other hand, as shown in FIG. 3B, due to the work function difference between the first work function layer 110 and the second work function layer 120, a barrier height $\Delta\Phi$ is formed at the interface 105 therebetween. The barrier height $\Delta\Phi$ blocks negative carriers (electrons) while allows positive carriers to pass through. Therefore, the background signal (the negative carriers in this case) can be filtered from the signal incident onto the filter 100.

Reference is made to FIG. 2A. The sensing electrode SE has a first work function value WF1, the first work function layer 110 has a second work function value WF2, and the second work function layer 120 has a third work function value WF3. As mentioned above, WF3>WF2. In some embodiments, WF3>WF2>WF1. In some embodiments, WF3−WF2 is in a range from about 0.05 eV to about 2 eV. If WF3−WF2 is out of the aforementioned range, the barrier height $\Delta\Phi$ (see FIG. 3B) may be not suitable for filtering the signal (e.g., the plasma in this case). In some embodiments, the barrier height $\Delta\Phi$ (see FIG. 3B) is in a range from about 0.2 eV to about 1.7 eV. As mentioned above, if the barrier height $\Delta\Phi$ is out of this range, the barrier height $\Delta\Phi$ may be not suitable for filtering the signal.

In some embodiments, the second work function layer 120 is made of metal, e.g., Au, Cu, combinations thereof, or the like. For example, an atomic percentage of metal in the second work function layer 120 is greater than about 95%. In some embodiments, the first work function layer 110 is made of metal oxide or metal nitride, e.g., $TiO_2$, NiO, combinations thereof, or the like. In some embodiments, the sensing electrode SE is made of metal, e.g., Al, Ni, or the like. For example, an atomic percentage of metal in the sensing electrode SE is greater than about 95%. In some embodiments, an atomic percentage of metal in the second work function layer 120 is greater than an atomic percentage of metal in the first work function layer 110. Further, an atomic percentage of oxygen in the sensing electrode SE is lower than an atomic percentage of oxygen in the first work function layer 110. Similar, an atomic percentage of oxygen in the second work function layer 120 is lower than the atomic percentage of oxygen in the first work function layer 110.

As shown in FIG. 2A, in some embodiments, a native oxide layer 276 may be formed over the sensing electrode SE. Therefore, the native oxide layer 276 and the sensing electrode SE include the same metal. For example, when the sensing electrode SE is made of Al, the native oxide layer 276 is made of aluminum oxide. In this case, the first work function layer 110 may be served as an adhesion layer for adhering the second work function layer 120 to the sensing electrode SE (and the native oxide layer 276). In some embodiments, the native oxide layer 276 has a thickness T4 less than the thickness T2 of the first work function layer 110.

In some embodiments, the sensing electrode SE has a thickness T1, the first work function layer 110 has a thickness T2, and the second work function layer 120 has a thickness T3. In some embodiments, the thickness T2 is in a range from about 10 nm to about 200 nm. If the thickness T2 is greater than about 200 nm, the first work function layer 110 may have high electrical resistance and thus degrade the sensing ability of the sensing element 200; if the thickness T2 is less than about 10 nm, the electrical properties of the first work function layer 110 may be changed. In some embodiments, the thickness T1 is in a range from about 50 nm to about 1200 nm. In some embodiments, the thickness T3 of the second work function layer 120 is greater than or equal to the thickness T2 of the first work function layer 110, such that the filter 100 has a good conductive performance. Similarly, the thickness T1 of the sensing electrode SE is greater than or equal to the thickness T2 of the first work function layer 110.

In some embodiments, the first work function layer 110 may be doped. That is, the first work function layer 110 may include N-type dopants or P-type dopants. The dopants in the first work function layer 110 are configured to shift the work function value thereof, such that the barrier height $\Delta\Phi$ (see FIG. 3B) between the first work function layer 110 and the second work function layer 120 can be tuned to a suitable value. When the first work function layer 110 include N-type dopants (e.g., P, As, or the like), the fermi level of the first work function layer 110 shifts toward the conductive band; when the first work function layer 110 include P-type dopants (e.g., B, or the like), the fermi level of the first work function layer 110 shifts toward the valence band. As such, by tuning the concentration of the dopants and the conductivity type of the dopants, the degree and direction of the fermi level of the first work function layer 110 can be determined.

FIG. 2B is a cross-sectional view of the sensing electrode SE and the filter 100 in FIG. 1 according to still some embodiments. In FIG. 2B, the filter 100 further includes an adhesion layer 130 between the first work function layer 110 and the second work function layer 120. In some embodiments, the second work function layer 120 may be formed over the adhesion layer 130 and then transferred to the top of the first work function layer 110. Therefore, the adhesion layer 130 may be a transfer layer for the second work function layer 120. In some embodiments, the adhesion layer 130 has a thickness T5 less than the thickness T2 of the first work function layer 110.

In some embodiments, the adhesion layer 130 is made of transition metal dichalcogenide (TMDC) materials which include a class of materials that have the general chemical formula of $MX_2$, wherein M is a transition metal element, and X is a chalcogen. The exemplary materials of the transition metal M include Ti, V, Co, Ni, Zr, Mo, Tc, Rh, Pd, Hf, Ta, W, Re, Ir, In, Sn, or Pt. Element X may be S, Se, or Te. Exemplary TMDC materials include $MoS_2$, $MoSe_2$, $PtSe_2$, $WS_2$, $WSe_2$, $MoTe_2$, and $WTe_2$ in accordance with some exemplary embodiments. TMDCs form a layered structure with the form X-M-X, wherein the chalcogen atoms X are distributed in two hexagonal planes separated by a plane of metal atoms M. Stated in another way, the adhesion layer 130 includes a first layer, a second layer over the first layer, and a third layer over the second layer. The first layer and the third layer include the chalcogen atoms X, and the second layer includes the transition metal M. In some embodiments, the first layer, the second layer, and the third layer are monolayers.

In some embodiments, the adhesion layer 130 is doped to form an NP junction with the first work function layer 110. That is, the adhesion layer 130 and the first work function layer 110 have opposite conductivity types. For example, the first work function layer 110 is N-type doped, and the first work function layer 110 is p-type doped, or vice versa. Other relevant structural details of the filter 100 in FIG. 2B are similar to the filter 100 in FIG. 2A, and, therefore, a description in this regard will not be repeated hereinafter.

Reference is made to FIG. 1. The sensing element 200 includes a substrate 210, at least one active region, an isolation structure 230, a gate structure 240, at least one reading contact 250, at least one sensing contact 260, and a sensing pad structure 270 including the sensing electrode SE. The active region may be a semiconductor fin 220 protruding from the substrate 210.

The isolation structure 230 is over the substrate 210 and laterally surrounds the bottom of the semiconductor fin 220. That is, the bottom portion of the semiconductor fin 220 is embedded in the isolation structure 230. The isolation structure 230 may be shallow trench isolation (STI) regions.

The gate structure 240 is over the isolation structure 230 and across the semiconductor fin 220. A portion of the semiconductor fin 220 covered by the gate structure 240 is referred to as a channel portion of the semiconductor fin 220. In some embodiments, there is no electrically conductive element physically connected to the gate structure 240, such that the gate structure 240 can be referred to as a floating gate. The gate structure 240 further defines a source portion and a drain portion in the semiconductor fin 220.

Two reading contacts 250 are adjacent to the gate structure 240 and directly on the isolation structure 230, such that the two reading contacts 250 are spaced apart from the semiconductor fin 220. The reading contacts 250 are on opposite sides of the gate structure 240. The reading contacts 250 are separated from the gate structure 240 by a dielectric material (e.g., the gate spacers 290, the CESL 320, and/or the ILD layer 325 in FIG. 6). As such, the gate structure 240, the reading contact 250, and the dielectric material therebetween form a capacitance. In some embodiments, the sensing element 200 includes a single reading contact 250 on one side of the gate structure 240.

Two sensing contacts 260 are adjacent to the gate structure 240 and directly on the isolation structure 230, such that the two sensing contacts 260 are spaced apart from the semiconductor fin 220. The sensing contacts 260 are on opposite sides of the gate structure 240. In some embodiments, the sensing contact 260 and the reading contact 250 are on opposite sides of the semiconductor fin 220, such that the semiconductor fin 220 is between the sensing contact 260 and the reading contact 250. The sensing contacts 260 are separated from the gate structure 240 by a dielectric material (e.g., the gate spacers 290, the CESL 320, and/or the ILD layer 325 in FIG. 6). As such, the gate structure 240, the sensing contact 260, and the dielectric material therebetween form a capacitance. In some embodiments, the sensing element 200 includes a single sensing contact 260 on one side of the gate structure 240. Moreover, the isolation structure 230 is in contact with the reading contacts 250, the sensing contacts 260, and the semiconductor fin 220.

The sensing pad structure 270 is electrically connected to the sensing contacts 260. In some embodiments, the sensing pad structure 270 is disposed over the sensing contacts 260 and the gate structure 240. In some embodiments, the sensing pad structure 270 includes one or more conductive line(s) 272 and a plurality of conductive vias 274 between adjacent conductive lines 272. Some of the conductive vias 274 interconnect the conductive line 272 and the sensing electrode SE, and some of the conductive vias 274 interconnect the conductive line 272 and the sensing contacts 260. In some embodiments, some of the conductive vias 274 interconnect adjacent levels of the conductive lines 272. The conductive line(s) 272 and the conductive vias 274 are conductive materials, such that the signal (e.g., carriers) can flow from the conductive lines 272 to the sensing contacts 260.

In some embodiments, the sensing pad structure 270 includes a single conductive line 272, which is connected to the sensing contacts 260 through the conductive vias 274. The single conductive line 272 may be at the lowest level (e.g., M0 level) of the sensing pad structure 270. In some other embodiments, the single conductive line 272 may at the middle level (e.g., M1, M2, . . . level) or the topmost level (e.g., Mn level) of the sensing pad structure 270 according to various requirements.

The sensing element 200 further includes a word line WL and a bit line BL. The word line WL is electrically connected to the reading contacts 250, and the bit line BL is electrically connected to the drain of the semiconductor fin 220. For example, the bit line BL is connected to the drain of the semiconductor fin 220 through a source/drain contact 282. Further, the word line WL is electrically isolated from the gate structure 240. In some embodiments, the source of the semiconductor fin 220 is electrically connected to a ground (line) GND, which provides a reference electrical potential (e.g., about 0V) to the semiconductor device 10 during programming, erasing, and/or reading processes, through a source/drain contact 284.

The filter 100 covers the sensing electrode SE. As such, the filter 100 (i.e., the first work function layer 110, the second work function layer 120, and the adhesion layer 130 as shown in FIGS. 2A and 2B) covers and is directly over the reading contacts 250, the sensing contacts 260, the gate structure 240, the word line WL, the bit line BL, and the ground line GND.

The semiconductor device 10 has four different states it can be in: programming, erasing, sensing, and reading. The semiconductor device 10 performs the four different states (program, erase, sense, and read) as follows: Programming—The start of a program cycle of the semiconductor device 10 begins by applying a positive voltage +V1 to the word line WL and applying a negative voltage –V2 to the bit line BL. Further, the source of the semiconductor fin 220 is connected to the ground GND. As such, the gate structure 240 is floating and an electric field is formed in the gate structure 240, driving electrons to flow from the substrate 210 to the gate structure 240 through tunneling effect, and the electrons can be stored in the gate structure 240.

Erasing—The start of an erase cycle of the semiconductor device 10 begins by applying a negative voltage –V1 to the word line WL and applying a positive voltage +V2 to the bit line BL. Further, the source of the semiconductor fin 220 is connected to the ground GND. As such, the gate structure 240 is floating and an electric field is formed in the gate structure 240, driving electrons to flow from the gate structure 240 to the substrate 210 through tunneling effect, and the gate structure 240 is supposed to be free of electrons.

Sensing—During the sense cycle of the semiconductor device 10, no power is applied to the word line WL, the bit line BL, and the source of the semiconductor fin 220. In other word, the semiconductor device 10 is powerless in the sensing mode. When e-beam light is incident on the sensing pad structure 270, electrons of the e-beam light enter the sensing pad structure 270 and flow to the sensing contact(s) 260. An electrical coupling is formed between the sensing contact(s) 260 and the gate structure 240, and the voltage in the gate structure 240 is changed.

Reading—The start of a read cycle of the semiconductor device 10 begins by applying a varied positive voltage +V3 to the word line WL, applying ground GND to the source of the semiconductor fin 220, and the gate structure 240 is floating, such that a corresponding current under the varied positive voltage +V3 is read from the bit line BL. With different intensities of the signal, the IV curve of the bit line BL and word line WL will be shifted in different degrees. As such, the intensity of the signal can be calculated from the IV curve.

Figure 4:
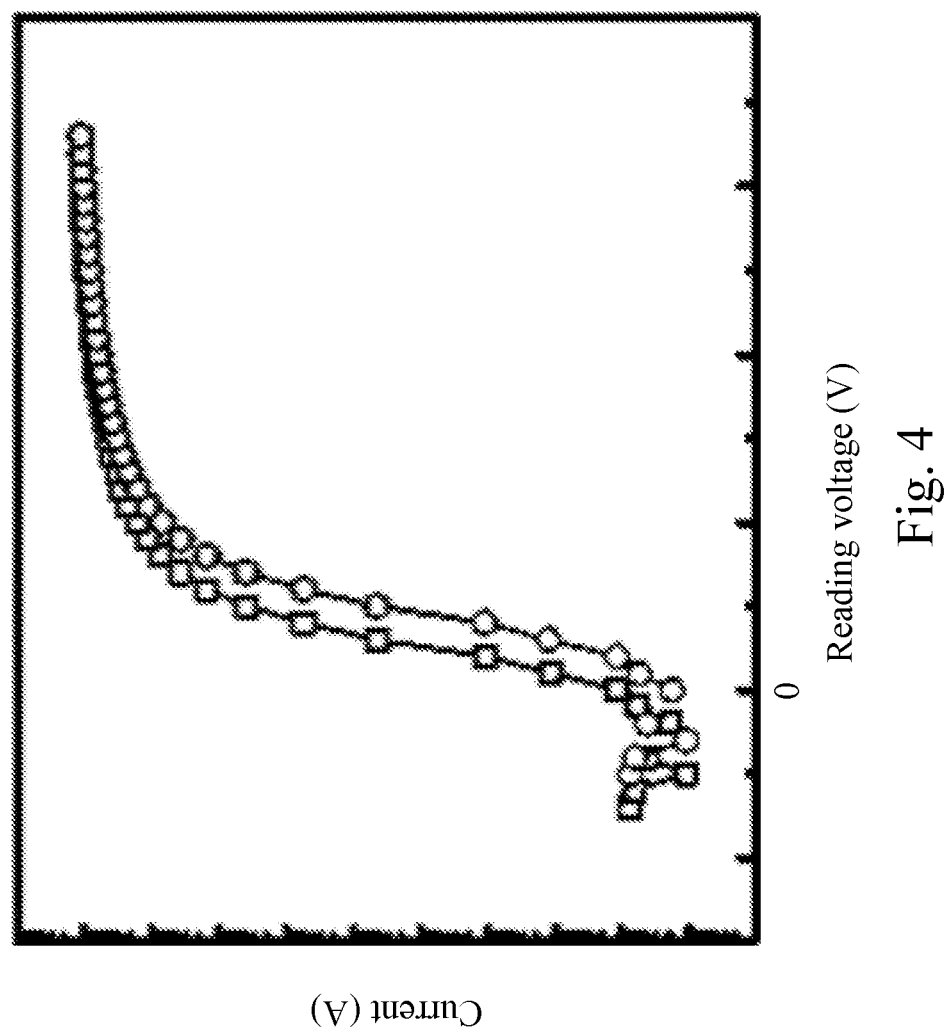
FIG. 4 is a plot of I-V characteristics of a bit line in exemplary semiconductor devices with and without the filter.

FIG. 4 is a plot of I-V characteristics of a bit line in exemplary semiconductor devices with and without the filter 100. The curve denoted with square dots represents I-V characteristic of the semiconductor device 10 with the filter 100, and the curve denoted with circle dots represents I-V characteristic of a semiconductor device without the filter 100. As shown in FIG. 4, with the filter 100, the IV curve shifts toward 0 V, which means the background signal is filtered. Further, the change of the threshold voltage of the semiconductor device 10 is more significant.

FIGS. 5-10B illustrate a method for manufacturing the semiconductor device 10 at various stages in accordance with some embodiments of the present disclosure. In addition to the semiconductor device 10, FIGS. 5-7A are perspective views of some embodiments of the semiconductor device 10 at intermediate stages during fabrication. FIGS. 7B-10B are cross-sectional views of some embodiments of the semiconductor device 10 at intermediate stages during fabrication along a first cut (e.g., cut I-I) in FIG. 7A.

Figure 5:
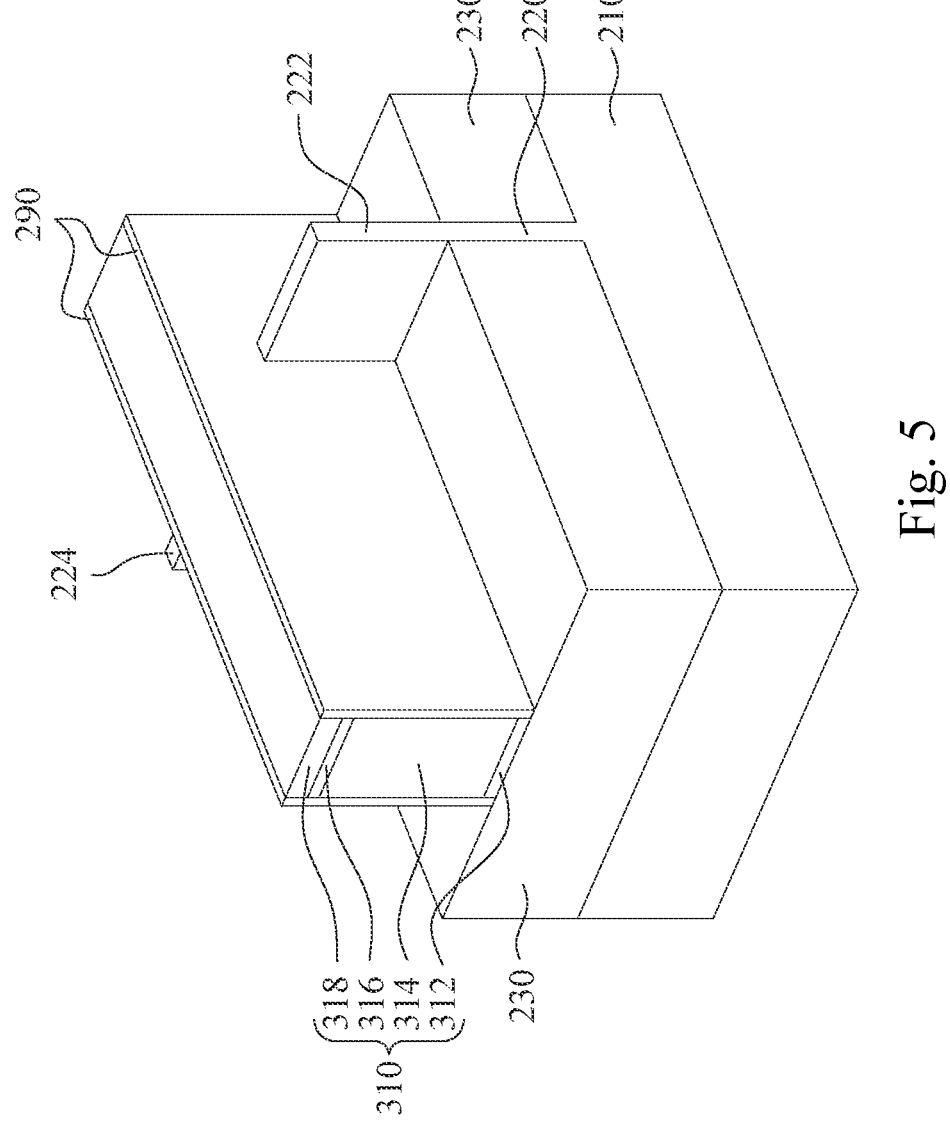
FIGS. 5-10B illustrate a method for manufacturing the semiconductor device at various stages in accordance with some embodiments of the present disclosure.

Reference is made to FIG. 5. The substrate 210 is provided. In some embodiments, the substrate 210 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 210 may include an epitaxial layer (epi-layer), which may be strained for performance enhancement, and/or may include a silicon-on-insulator (SOI) structure.

At least one semiconductor fin 220 is formed on the substrate 210. The semiconductor fin 220 may be formed using, for example, a patterning process to form trenches such that trenches are formed on opposite sides of the semiconductor fin 220. As discussed in greater detail below, the semiconductor fin 220 will be used to form FinFETs. It is understood that a single semiconductor fin 220 is illustrated for purposes of illustration, but other embodiments may include any number of semiconductor fins. In some embodiments, one or more dummy semiconductor fins are formed adjacent to the semiconductor fin 220.

Isolation structures 230, such as shallow trench isolations (STI), are disposed in the trenches and over the substrate 210. The isolation structures 230 can be equivalently referred to as an isolation insulating layer in some embodiments. The isolation structures 230 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 230 are formed through a process such as CVD, flowable CVD (FCVD), or a spin-on-glass process, although any acceptable process may be utilized. Subsequently, portions of the isolation structures 230 extending over the top surfaces of the semiconductor fin 220 are removed using, for example, an etching back process, chemical mechanical polishing (CMP), or the like.

The isolation structures 230 are then recessed to expose an upper portion of the semiconductor fin 220. In some embodiments, the isolation structures 230 are recessed using a single etch processes, or multiple etch processes. In some embodiments in which the isolation structures 230 is made of silicon oxide, the etch process may be, for example, a dry etch, a chemical etch, or a wet cleaning process. For example, the chemical etch may employ fluorine-containing chemical such as dilute hydrofluoric (dHF) acid.

After the semiconductor fin 220 and the isolation structures 230 are formed, at least one dummy gate structure 310 is formed over the substrate 210 and at least partially disposed over the semiconductor fin 220. The portion of the semiconductor fin 220 underlying the dummy gate structure 310 may be referred to as a channel region, and the semiconductor fin 220 may be referred to as a channel layer. The dummy gate structure 310 may also define source/drain portions of the semiconductor fin 220, for example, the regions of the semiconductor fin 220 adjacent and on opposing sides of the channel region.

Dummy gate formation operation first forms a dummy gate dielectric layer over the semiconductor fin 220. Subsequently, a dummy gate electrode layer and a hard mask which may include multiple layers (e.g., an oxide layer and a nitride layer) are formed over the dummy gate dielectric layer. The hard mask is then patterned to be an oxide mask layer 318 and a nitride mask layer 316, followed by patterning the dummy gate electrode layer to be a dummy gate electrode 314 by using the oxide mask layer 318 and the nitride mask layer 316 as etch masks. In some embodiments, after patterning the dummy gate electrode layer, the dummy gate dielectric layer is removed from the S/D regions of the semiconductor fin 220 and to be a dummy gate dielectric layer 312. The etch process may include a wet etch, a dry etch, and/or combinations thereof. The etch process is chosen to selectively etch the dummy gate dielectric layer without substantially etching the semiconductor fin 220, the dummy gate electrode 314, the nitride mask layer 316, and the oxide mask layer 318.

After formation of the dummy gate structure 310 is completed, gate spacers 290 are formed on sidewalls of the dummy gate structure 310. In some embodiments of the gate spacer formation operations, a spacer material layer is deposited on the substrate 210. The spacer material layer may be a conformal layer that is subsequently etched back to form the gate spacers 290. In some embodiments, the spacer material layer includes multiple layers. The gate spacers 290 are made of a suitable material such as silicon oxide, silicon nitride, silicon carbide, silicon oxynitride, SiCN, silicon oxycarbide, SiOCN, and/or combinations thereof. By way of example and not limitation, the spacer material layer may be formed by depositing dielectric materials over the dummy gate structure 310 using processes such as, an ALD process, a PEALD (plasma enhanced ALD) process, a PECVD process, a subatmospheric CVD (SACVD) process, or other suitable process. An anisotropic etching process is then performed on the spacer material layer to expose portions of the semiconductor fin 220 not covered by the dummy gate structure 310 (e.g., in the source/drain portions of the semiconductor fin 220). Portions of the spacer material layer directly above the dummy gate structure 310 may be removed by this anisotropic etching process. Portions of the spacer material layer on sidewalls of the dummy gate structure 310 may remain, forming gate sidewall spacers, which are denoted as the gate spacers 290, for the sake of simplicity. In some embodiments, the gate spacers 290 may be used to offset subsequently formed doped regions, such as source/drain regions. The gate spacers 290 may further be used for designing or modifying the source/drain region profile.

In some embodiments, source/drain regions 222 and 224 are formed in the source/drain portions of the semiconductor fin 220. For example, at least one implantation process is performed, such that dopants are implanted in the source/drain portions of the semiconductor fin 220 to form the source/drain regions 222 and 224. The dummy gate structure 310 and the gate spacers 290 act as a mask for the ion implantation. Optionally, the source/drain portions of the semiconductor fin 220 are recessed and source/drain epitaxial structures are formed in the recesses and over the source/drain portions of the semiconductor fin 220.

Figure 6:
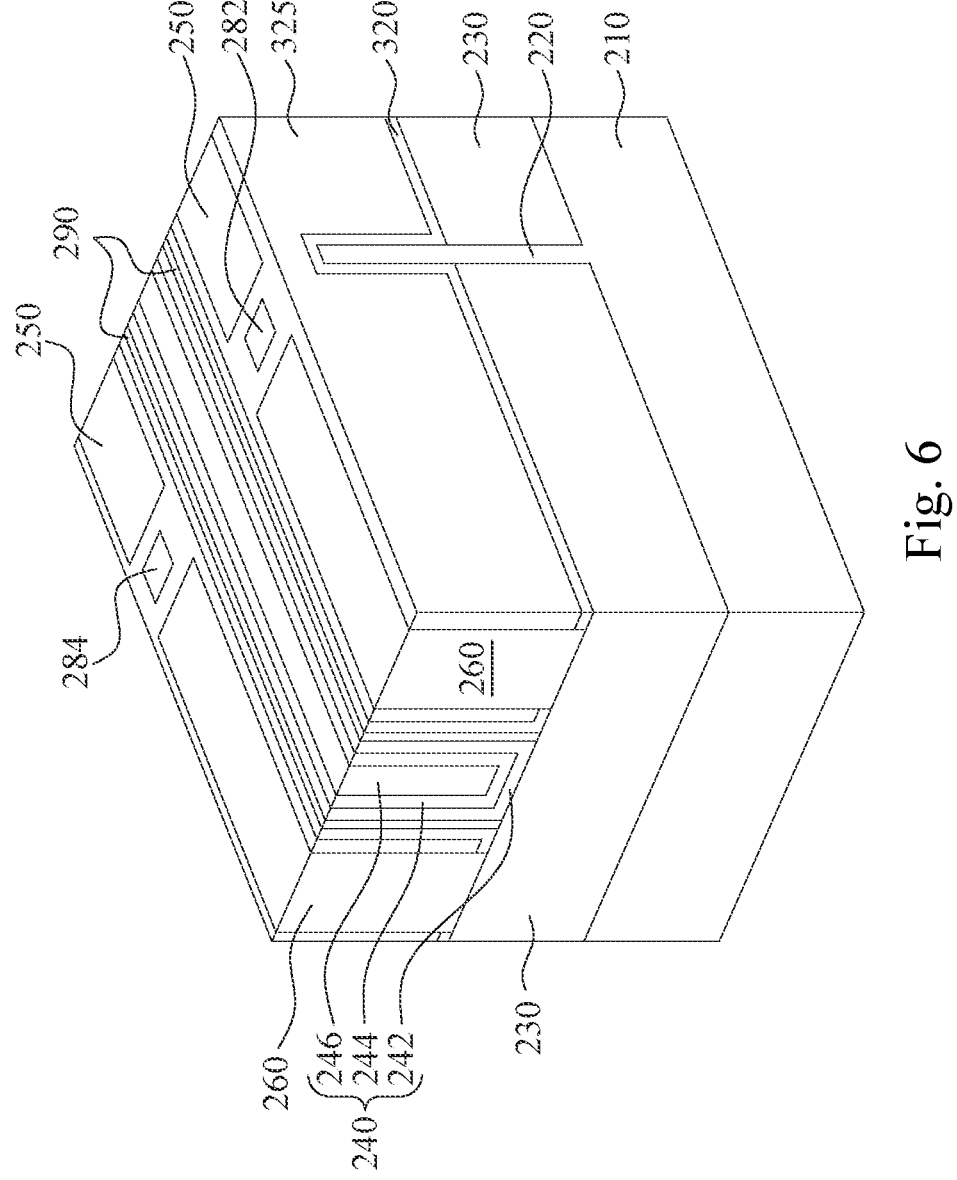

Reference is made to FIG. 6. An interlayer dielectric (ILD) layer 325 is formed on the substrate 210. In some embodiments, a contact etch stop layer (CESL) 320 is also formed prior to forming the ILD layer 325. In some embodiments, the CESL 320 includes a silicon nitride layer, a silicon oxynitride layer, and/or other suitable materials having a different etch selectivity than the ILD layer 325. The CESL 320 may be formed by plasma-enhanced chemical vapor deposition (PECVD) process and/or other suitable deposition or oxidation processes. In some embodiments, the ILD layer 325 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 320. The ILD layer 325 may be deposited by a subatmospheric CVD (SACVD) process, a flowable CVD process, or other suitable deposition technique. In some embodiments, after formation of the ILD layer 325, the wafer may be subject to a high thermal budget process to anneal the ILD layer 325.

In some examples, after forming the ILD layer 325, a planarization process may be performed to remove excessive materials of the ILD layer 325. For example, a planarization process includes a chemical mechanical planarization (CMP) process which removes portions of the ILD layer 325 (and the CESL 320, if present) overlying the dummy gate structure 310. In some embodiments, the CMP process also removes the nitride mask layer 316 and the oxide mask layer 318 (as shown in FIG. 5) and exposes the dummy gate electrode 314 (as shown in FIG. 5).

The dummy gate electrode 314 and the dummy gate dielectric layer 312 (see FIG. 5) are then removed, resulting in a gate trench between the gate spacers 290. The dummy gate electrode 314 and the dummy gate dielectric layer 312 are removed using a selective etching process (e.g., selective dry etching, selective wet etching, or combinations thereof) that etches materials in the dummy gate electrode 314 and the dummy gate dielectric layer 312 at a faster etch rate than it etches other materials (e.g., the gate spacers 290, the CESL 320, and/or the ILD layer 325).

Thereafter, a replacement gate structure 240 is formed in the gate trench. The gate structure 240 may be the final gates of FinFETs. The final gate structure may be a high-k/metal gate stack, however other compositions are possible. In some embodiments, the gate structure 240 forms the gate associated with the three-sides of the channel region provided by the semiconductor fin 220. Stated another way, the gate structure 240 wraps around the semiconductor fin 220 on three sides. In various embodiments, the (high-k/metal) gate structure 240 includes a gate dielectric layer 242 lining the gate trench and a gate electrode over the gate dielectric layer 242. The gate electrode may include a work function metal layer 244 formed over the gate dielectric layer 242 and a fill metal 246 formed over the work function metal layer 244 and filling a remainder of gate trenches. The gate dielectric layer 242 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 244 and/or fill metal 246 used within the high-k/metal gate structure 240 may include a metal, metal alloy, or metal silicide. Formation of the high-k/metal gate structure 240 may include multiple deposition processes to form various gate materials, one or more liner layers, and one or more CMP processes to remove excessive gate materials.

In some embodiments, the interfacial layer of the gate dielectric layer 242 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 242 may include hafnium oxide (HfO$_2$). Alternatively, the gate dielectric layer 242 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), silicon nitride (Si$_3$N$_4$), oxynitrides (SiON), and combinations thereof.

The work function metal layer 244 may include work function metals to provide a suitable work function for the high-k/metal gate structure 240. For an n-type FinFET, the work function metal layer 244 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

One or more etching processes are performed to form contact openings extending though the ILD layer 325 to expose the semiconductor fin 220 or the isolation structures 230. Reading contacts 250, sensing contacts 260, and source/drain contacts 282 and 284 are respectively formed in the contact openings. Formation of the contacts includes, by way of example and not limitation, depositing one or more conductive materials overfilling the contact openings and then performing a CMP process to remove excessive conductive materials outside the contact openings.

Figure 7A:
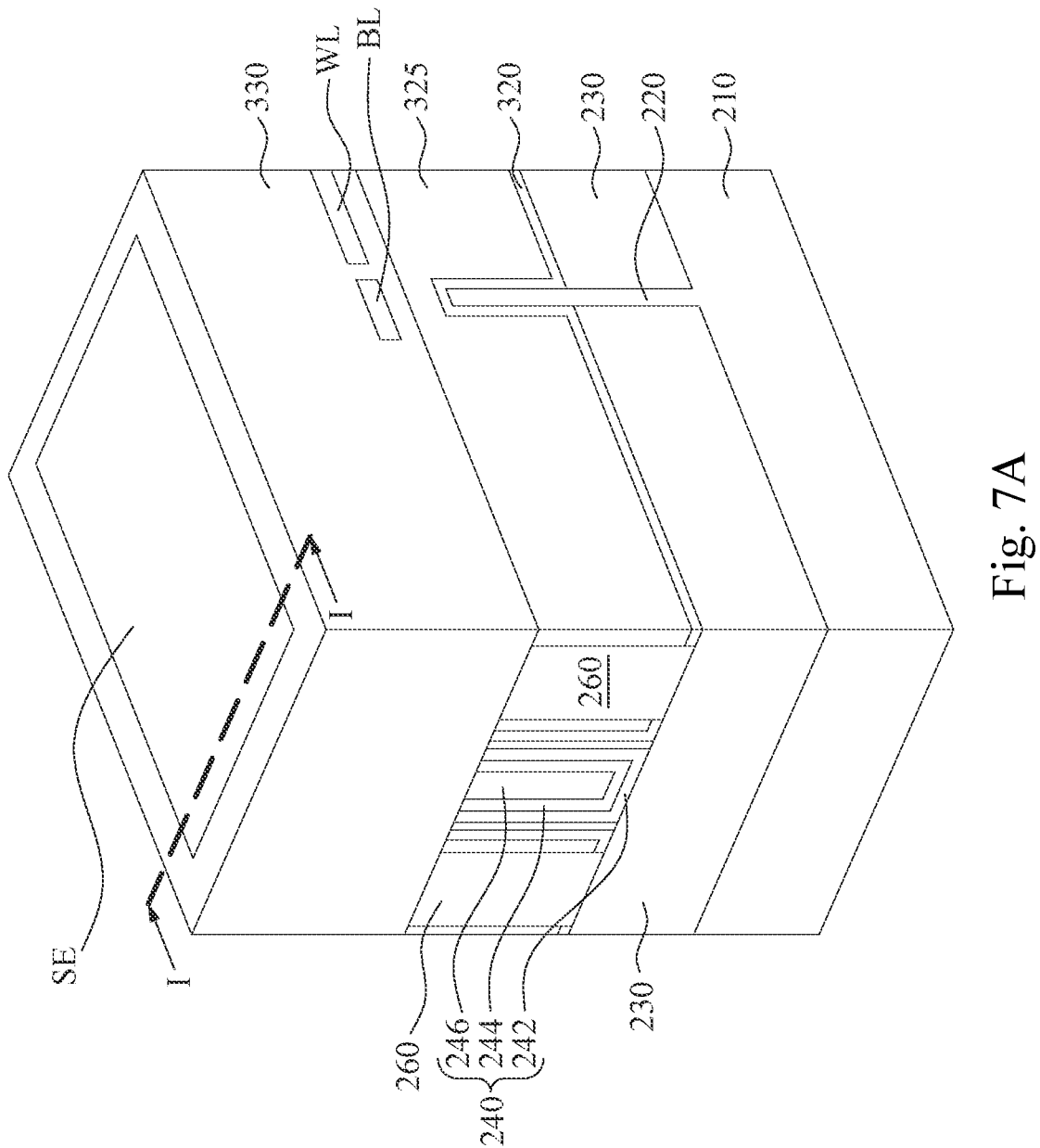
Figure 7B:
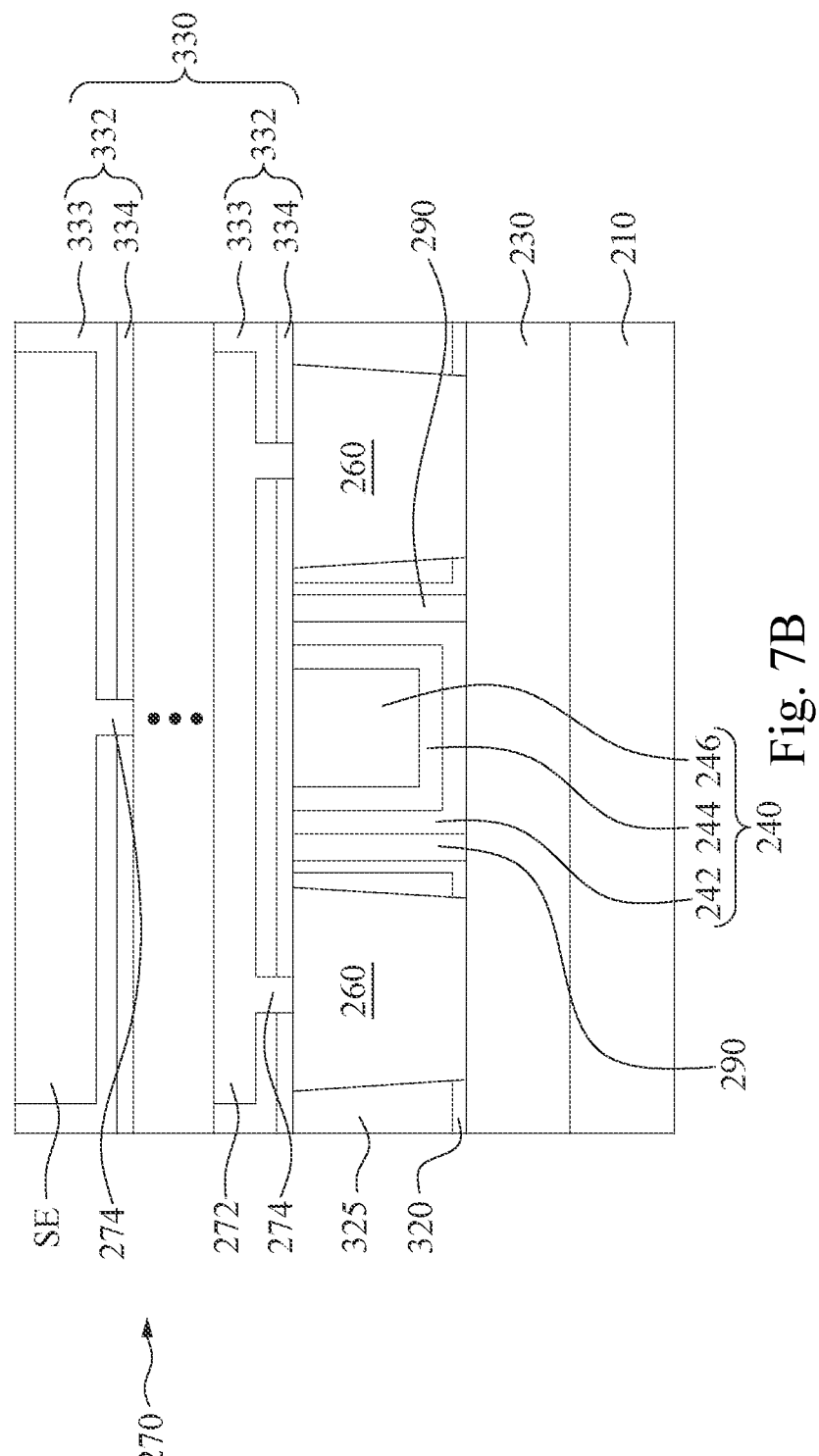

Reference is then made to FIGS. 7A-7B, where FIG. 7B is a cross-sectional view taken along line I-I of FIG. 7A. A multilayer interconnection (MLI) structure 330 is formed over the structure of FIG. 6. The MLI structure 330 may include a plurality of metallization layers 332. The number of metallization layers 332 may vary according to design specifications of the semiconductor device. The middle layers of metallization layers 332 are omitted in FIG. 7B for the sake of simplicity. The metallization layers 332 each includes an inter-metal dielectric (IMD) layer 333 and an etch stop layer 334. For clarity, the IMD layers 333 and the etch stop layers 334 are shown in FIG. 7B and are omitted in FIG. 7A. The metallization layers 332 include one or more horizontal interconnects, such as the word line WL, the bit line BL, the ground line GND (see FIG. 1), and sensing electrode SE, respectively extending horizontally or laterally in the IMD layers 333 and vertical interconnects, such as conductive vias 274, respectively extending vertically in the IMD layers 333 and pass through the etch stop layers 334.

As mentioned above, the sensing electrode SE, the conductive line 272, and the conductive vias 274 form the sensing pad structure 270.

The word line WL, the bit line BL, the ground line GND, the sensing electrode SE, the conductive line 272, and the conductive vias 274 can be formed using, for example, a single damascene process, a dual damascene process, the like, or combinations thereof. In some embodiments, the IMD layers 333 may include low-k dielectric materials having k values, for example, lower than about 4.0 or even 2.0 disposed between such conductive features. In some embodiments, the IMD layers 333 may be made of, for example, phosphosilicate glass (PSG), borophosphosilicate glass (BPSG), fluorosilicate glass (FSG), SiO$_x$C$_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. In some embodiments, the etch stop layers 334 may be formed of SiN$_x$, SiCN, SiO$_2$, CN, AlO$_x$N$_y$, combinations thereof, or the like, deposited by CVD or PECVD techniques. The word line WL, the bit line BL, the ground line GND, the sensing electrode SE, the conductive line 272, and the conductive vias 274 may include metal materials such as copper, aluminum, tungsten, combinations thereof, or the like. In some embodiments, the word line WL, the bit line BL, the ground line GND, sensing electrode SE, the conductive line 272, and the conductive vias 274 may further include one or more barrier/adhesion layers (not shown) to protect the respective IMD layers 333 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. As shown in FIG. 7B, there is no via interconnecting the horizontal interconnects and/or vertical interconnects of the MLI structure 330 and the gate structure 240.

Figure 8A:
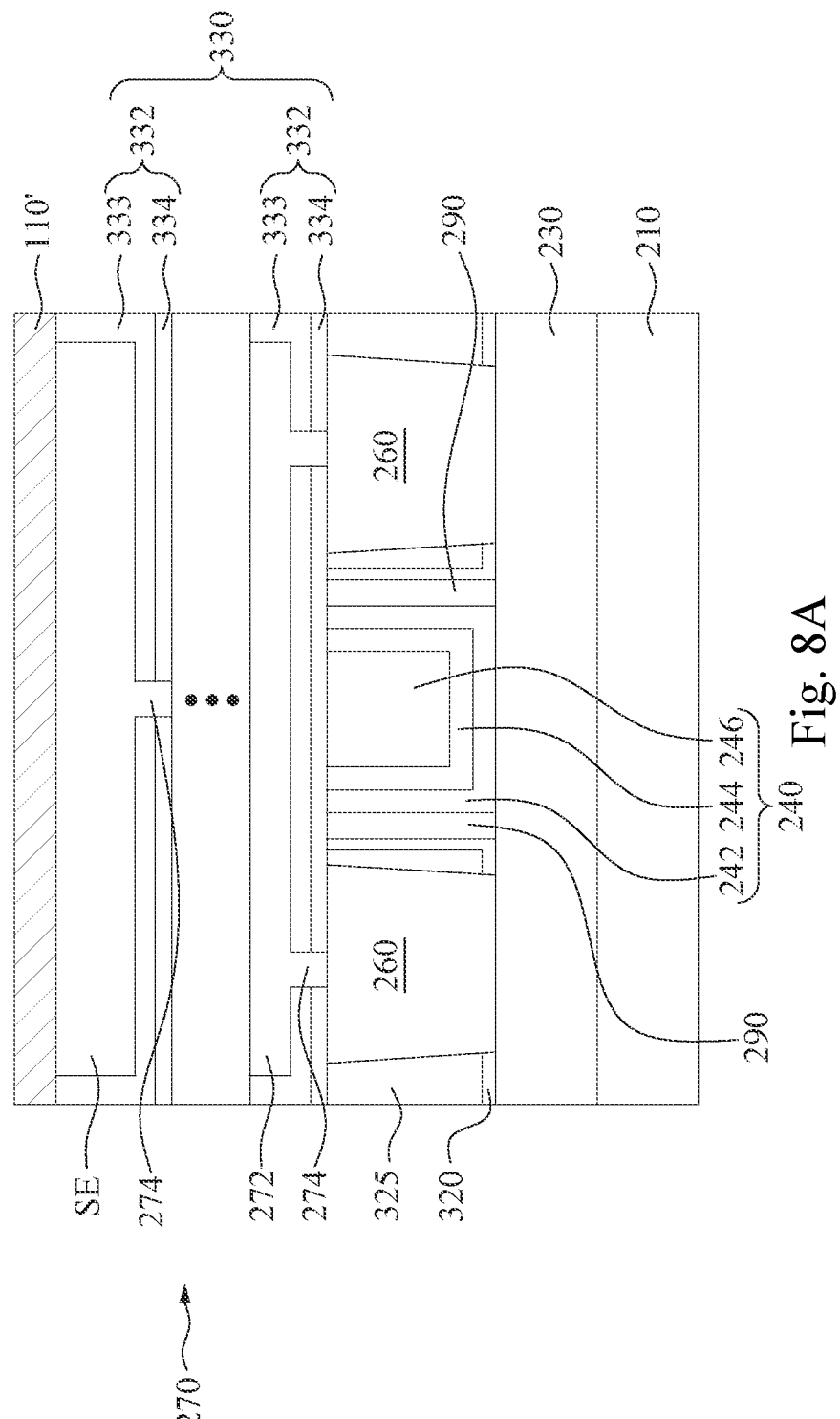
Figure 8B:
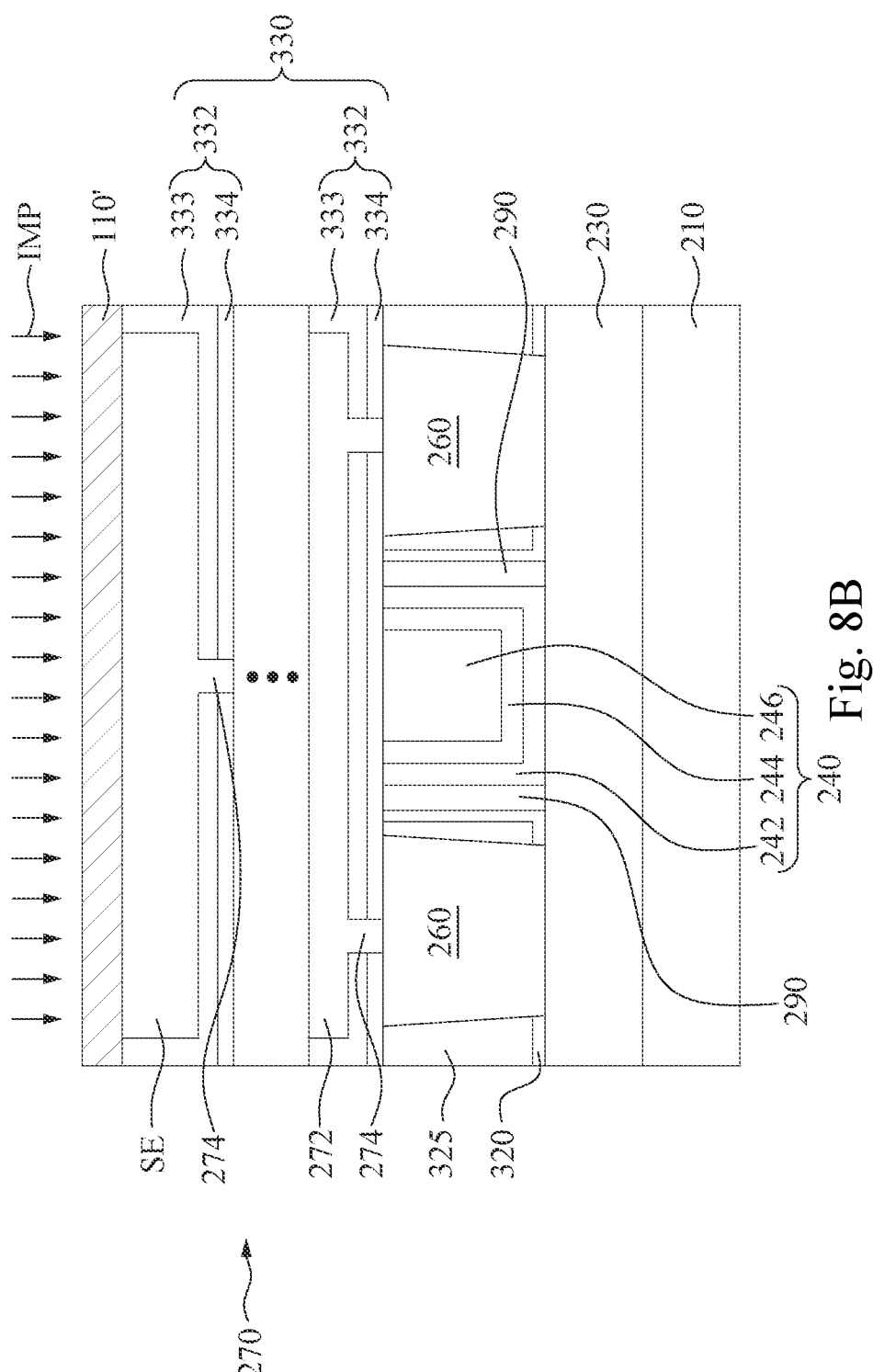

Reference is made to FIG. 8A. A first conductive film 110' is formed over the MLI structure 330. In some embodiments, a native oxide layer 276 (see FIG. 2A) is formed over the sensing electrode SE, such that the first conductive film 110' is formed on the native oxide layer 276. The first conductive film 110' may be made of metal oxide, such that the first conductive film 110' has a good adhesion to the native oxide layer 276. In some embodiments, the first conductive film 110' is in direct contact with the sensing electrode SE as shown in FIGS. 8A and 8B. That is, the native oxide layer 276 may be removed prior to forming the first conductive film 110'. By way of example and not limitation, the first conductive film 110' may be formed by depositing materials over the MLI structure 330 using processes such as, an ALD process, a PEALD (plasma enhanced ALD) process, a PECVD process, a subatmospheric CVD (SACVD) process, or other suitable process. In some embodiments, the work function value of the first conductive film 110' is greater than the work function value of the sensing electrode SE.

Reference is made to FIG. 8B. As mentioned above, in some embodiments, the first conductive film 110' can be doped. For example, an implantation process IMP is performed to dope the first conductive film 110'. In some exemplary embodiments, the first conductive film 110' in a p-type includes B dopants and the first conductive film 110' in an n-type includes P dopants.

Figure 9A:
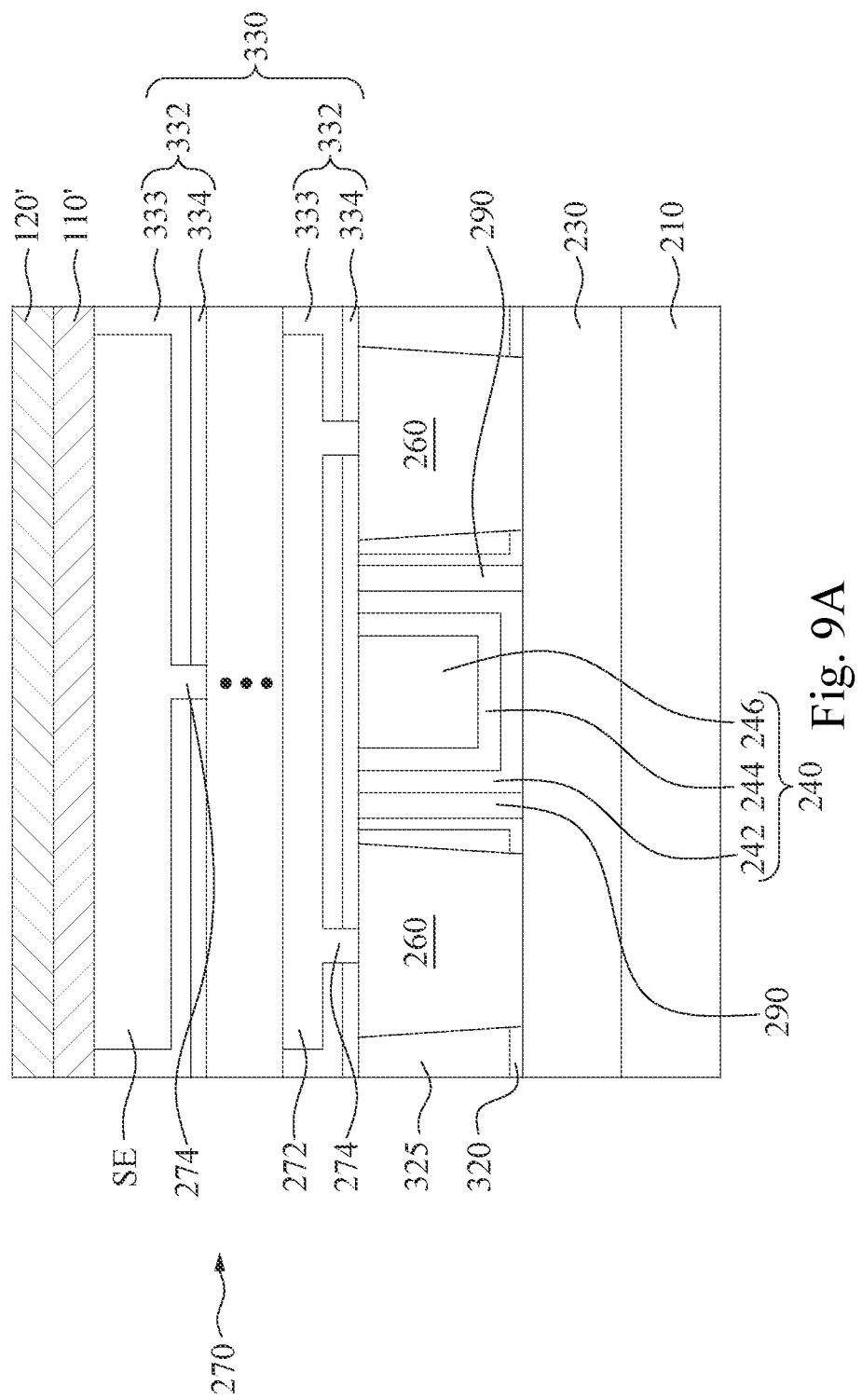

Reference is made to FIG. 9A. A second conductive film 120' is formed over the first conductive film 110'. The second conductive film 120' may be made of metal, such that the second conductive film 120' has a good conductivity for the sensed signal (charged carriers). By way of example and not limitation, the second conductive film 120' may be formed by depositing metal materials over the first conductive film 110' using processes such as, an ALD process, a PEALD (plasma enhanced ALD) process, a PECVD process, a subatmospheric CVD (SACVD) process, or other suitable process. The work function value of the second conductive film 120' is greater than the work function value of the first conductive film 110'.

Figure 9B:
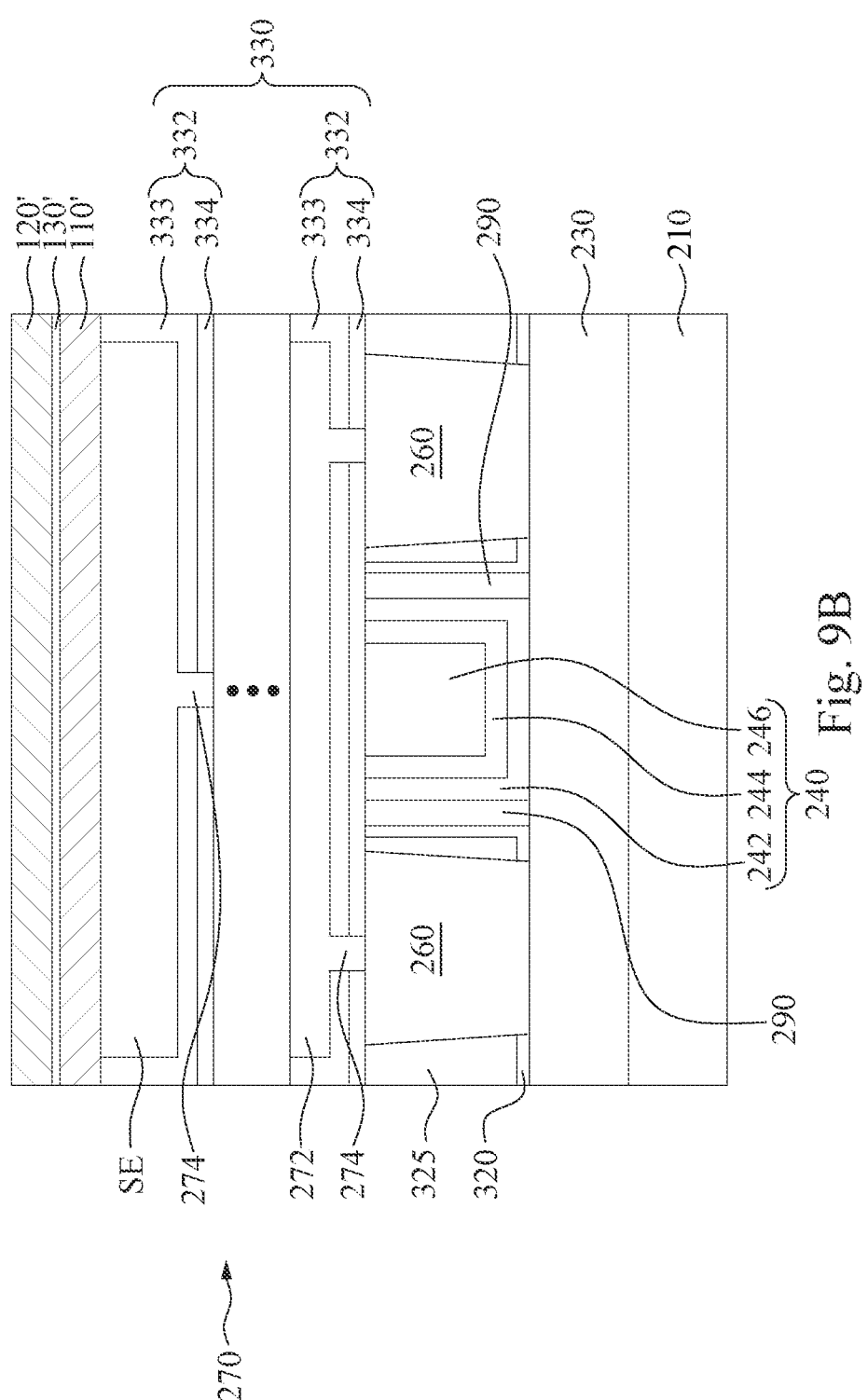

Reference is made to FIG. 9B. In some embodiments, the second conductive film 120' is formed over another substrate (or wafer) and then be transferred onto the first conductive film 110'. For example, an adhesion layer 130' is attached to the second conductive film 120', and the second conductive film 120' and the adhesion layer 130' are both transferred onto the first conductive film 110'. As such, the adhesion layer 130' adheres the second conductive film 120' to the first conductive film 110'.

Reference is made to FIGS. 10A and 10B. The second conductive film 120' (the adhesion layer 130') and the first conductive film 110' are patterned to form the filter 100. For example, one or more etching process(es) is(are) performed to pattern the second conductive film 120' and the first conductive film 110'. In some embodiments, an area of the top surface 102 of the filter 100 is substantially the same as an area of the top surface 202 of the sensing electrode SE as shown in FIG. 1. In some other embodiments, the area of the top surface 102 of the filter 100 is greater than the area of the top surface 202 of the sensing electrode SE as shown in FIGS. 10A and 10B. For example, the filter 100 covers the entirety of the top surface 202 of the sensing electrode SE.

Figure 11:
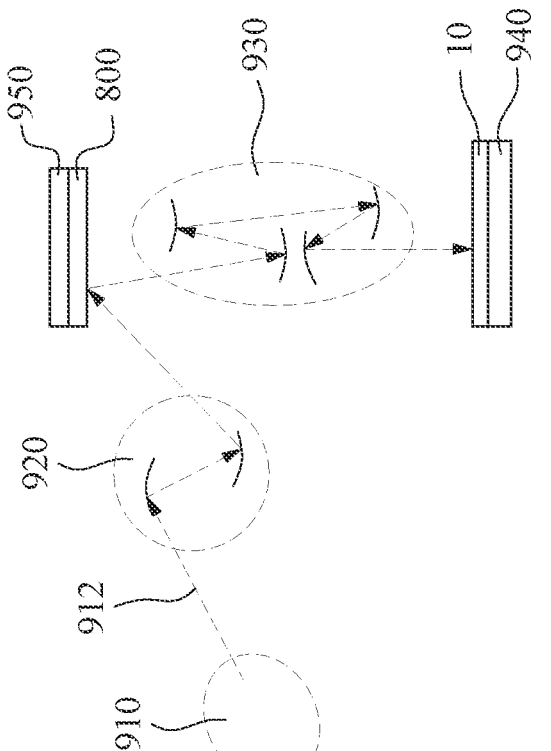
FIG. 11 is a schematic and diagrammatic view of a lithography exposure apparatus in accordance with some embodiments.

FIG. 11 is a schematic and diagrammatic view of a lithography exposure apparatus 900 in accordance with some embodiments. The lithography exposure apparatus 900 includes a light source 910, an illuminator 920, a projection optics module (or projection optics box (POB)) 930 and a substrate stage 940 in accordance with some embodiments. The light source 910 is configured to generate radiations 912 having a wavelength ranging between about 1 nm and about 100 nm. In some embodiments, the light source 910 generates an EUV light with a wavelength centered at about 13.5 nm. Accordingly, the light source 910 is also referred to as EUV light source. However, it should be appreciated that the light source 910 should not be limited to emitting EUV light. The light source 910 can be utilized to perform any high-intensity photon emission from excited target material.

In various embodiments, the illuminator 920 includes various refractive optic components, such as a single lens or a lens system having multiple lenses (zone plates) or alternatively reflective optics (for EUV lithography exposure apparatus), such as a single mirror or a mirror system having multiple mirrors in order to direct light from the light source 910 onto a photomask 800 secured on the reticle chuck 950.

The projection optics module (or projection optics box (POB)) 930 is configured for imaging the pattern of the photomask 800 onto a semiconductor wafer secured on the substrate stage 940 of the lithography exposure apparatus 900 for a lithography exposure process. However, during detecting the intensity of EUV light, the semiconductor device 10 is secured on the substrate stage 940. In some embodiments, the POB 930 has refractive optics (such as for a UV lithography exposure apparatus) or alternatively reflective optics (such as for an EUV lithography exposure apparatus) in various embodiments. The illuminator 920 and the POB 930 are collectively referred to as an optical module of the lithography exposure apparatus 900.

Figure 12:
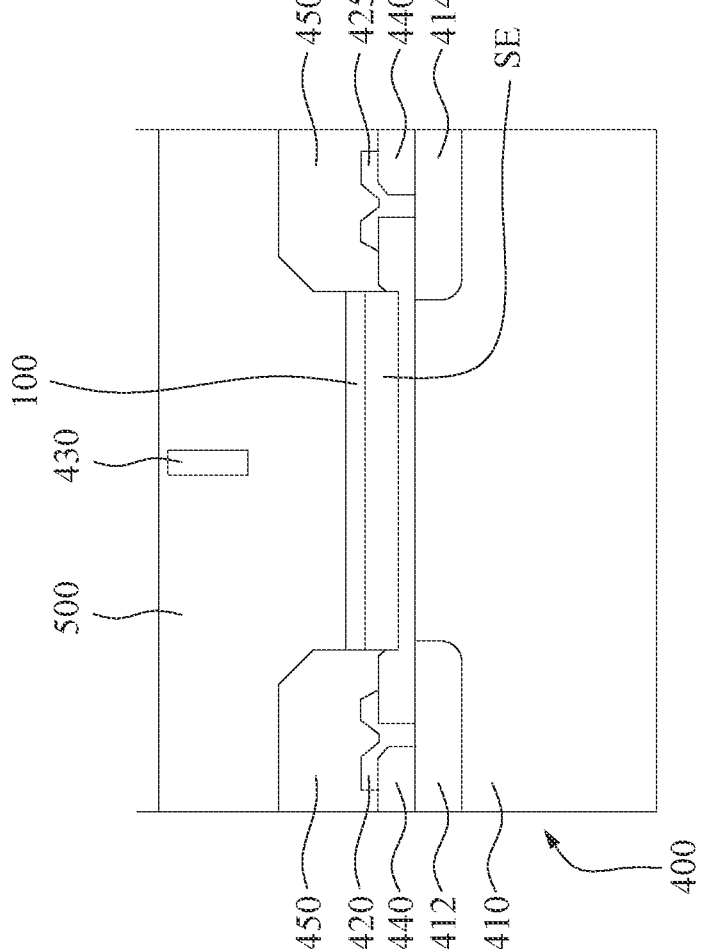
FIG. 12 is a cross-sectional view of a semiconductor device in accordance with some embodiments.

FIG. 12 is a cross-sectional view of a semiconductor device 10' in accordance with some embodiments. In FIG. 12, semiconductor device 10' includes a sensing element 400 and the filter 100 over the sensing electrode SE of the sensing element 400. A cross-sectional view of the filter 100 and the sensing electrode SE are similar to or the same as the structure shown in FIG. 2A or FIG. 2B, and, therefore, a description in this regard will not be repeated hereinafter. The sensing element 400 is an ion sensor and may be a metal-oxide-semiconductor field-effect transistor (MOS-FET). The sensing element 400 includes a substrate 410 having a source region 412 and a drain region 414, a source contact 420 and a drain contact 425, the sensing electrode SE, and a reference electrode 430. The source region 412 and the drain region 414 are doped regions. The source contact 420 is over the source region 412 and is electrically connected to the source region 412, and the drain contact 425 is over the drain region 414 and is electrically connected to the drain region 414. In some embodiments, the sensing element 400 further includes a dielectric layer 440 surrounding bottoms of the source contact 420 and the drain contact 425 and between the substrate 410 and the sensing electrode SE. In some embodiments, the sensing element 400 further includes encapsulations 450 covering the source contact 420 and the drain contact 425, respectively. In some embodiments, the encapsulations 450 are made of electrically isolation materials, such as dielectric materials. An electrolyte 500 is deposited over the sensing electrode SE, and the reference electrode 430 is immersed in the electrolyte 500 and above the sensing electrode SE.

Figure 13:
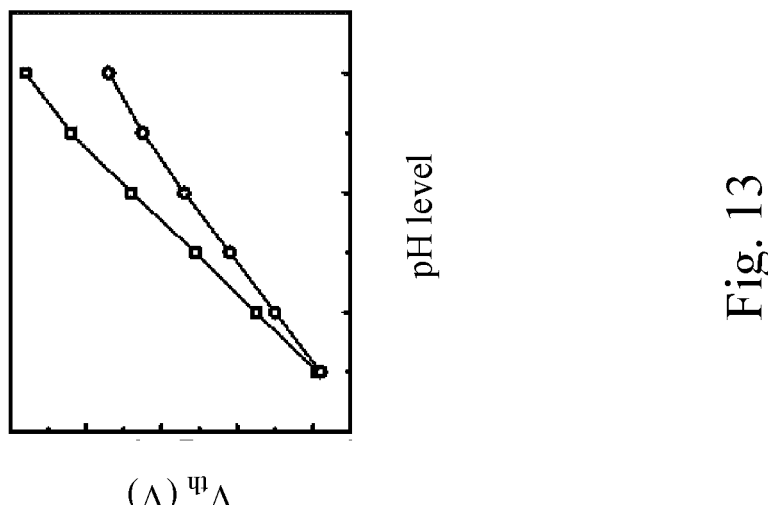
FIG. 13 is a plot of pH-Vth (threshold voltage of the MOSFET) characteristics in exemplary semiconductor devices with and without the filter.

FIG. 13 is a plot of pH-Vth (threshold voltage of the MOSFET) characteristics in exemplary semiconductor devices with and without the filter 100. The curve denoted with square dots represents pH-Vth characteristic of the semiconductor device 10' with the filter 100, and the curve denoted with circle dots represents pH-Vth characteristic of a semiconductor device without the filter 100. As shown in FIG. 13, with the filter 100, the pH-Vth curve shifts upwards, which means the background signal is filtered.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the filter filters the background of a signal to increase the accuracy of the sensing element. Further, the filter may have a good adhesion to the sensing electrode of the sensing element. In addition, dopants may be doped into the conductive layers of the filter such that the barrier height between the conductive layers of the filter can be tuned.

According to some embodiments, a semiconductor device includes a sensing element including a sensing electrode and a filter covering the sensing electrode. The filter includes a first work function layer and a second work function layer. The first work function layer is over the sensing electrode. The second work function layer is over the first work function layer. A work function value of the second work function layer is greater than a work function value of the first work function layer, and an atomic percentage of metal in the second work function layer is greater than an atomic percentage of metal in the first work function layer.

According to some embodiments, a method includes providing a sensing element including a sensing electrode. A metal oxide layer is over the sensing element to cover the sensing electrode. A metal layer is formed over the metal oxide layer. A barrier height between the metal layer and the metal oxide layer is in a range from about 0.2 eV to about 1.7 eV. The metal layer and the metal oxide layer are patterned to form a filter over the sensing electrode. The gate structure is across the semiconductor fin. The sensing contact is directly on the isolation structure and adjacent to the gate structure. The sensing electrode is electrically connected to the sensing contact. The reading contact is directly on the isolation structure and adjacent to the gate structure. The filter covers the sensing electrode and includes a first work function layer and a second work function layer over the first work function layer. A work function value of the second work function layer is greater than a work function value of the first work function layer.

According to some embodiments, a semiconductor device includes a sensing element and a filter. The sensing element includes a semiconductor fin, an isolation structure, a gate structure, a sensing contact, a sensing electrode, and a reading contact. The semiconductor fin is over a substrate. The isolation structure laterally surrounds a bottom of the semiconductor fin. The gate structure is across the semiconductor fin. The sensing contact is directly on the isolation structure and adjacent to the gate structure. The sensing electrode is electrically connected to the sensing contact. The reading contact is directly on the isolation structure and adjacent to the gate structure. The filter covers the sensing electrode and includes a first work function layer and a second work function layer over the first work function layer. A work function value of the second work function layer is greater than a work function value of the first work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a sensing element comprising a sensing electrode; and
depositing a metal oxide layer over the sensing element to cover the sensing electrode;
forming a metal layer over the metal oxide layer, wherein a barrier height between the metal layer and the metal oxide layer is in a range from about 0.2 eV to about 1.7 eV; and
patterning the metal layer and the metal oxide layer to form a filter over the sensing electrode.

2. The method of claim 1, wherein forming the sensing element comprises:
forming an isolation structure over a substrate to define an active region in the substrate;
forming a gate structure over the substrate and across the active region;
forming a reading contact and a sensing contact over the isolation structure; and
forming an interconnection structure over the gate structure, the reading contact, and the sensing contact, wherein the interconnection structure comprises the sensing electrode electrically connected to the sensing contact.

3. The method of claim 2, wherein the filter covers the reading contact.

4. The method of claim 2, wherein the filter covers the sensing contact.

5. The method of claim 2, wherein the reading contact and the sensing contact are on opposite sides of the active region.

6. The method of claim 2, wherein the interconnection structure further comprises a word line connected to the reading contact.

7. The method of claim 1, wherein forming the metal layer over the metal oxide layer comprises:
depositing the metal layer over an adhesion layer; and
transferring the metal layer with the adhesion layer onto the metal oxide layer.

8. The method of claim 1, wherein the metal oxide layer is TiO2, NiO, or combinations thereof.

9. A method comprising:
providing a structure comprising a gate structure across a semiconductor fin, wherein a bottom of the semiconductor fin is surrounded by isolation structures;
forming a reading contact and a sensing contact over the isolation structures and on opposite sides of the semiconductor fin;
forming a sensing electrode over the structure and electrically connected to the reading contact;
depositing a first work function layer to cover the sensing electrode;
depositing a second work function layer to cover the first work function layer, wherein a work function value of the second work function layer is greater than a work function value of the first work function layer, and an atomic percentage of metal in the second work function layer is greater than an atomic percentage of metal in the first work function layer; and
patterning the second work function layer and the first work function layer to form a filter covering the sensing electrode.

10. The method of claim 9, further comprising forming a word line over and electrically connected to the reading contact prior to forming the sensing electrode.

11. The method of claim 9, further comprising forming a bit line over and electrically connected to the semiconductor fin prior to forming the sensing electrode.

12. The method of claim 9, wherein an area of a top surface of the filter is greater than an area of a top surface of the sensing electrode.

13. The method of claim 9, wherein the work function value of the first work function layer is greater than a work function value of the sensing electrode.

14. The method of claim 9, further comprising depositing a transition metal dichalcogenide (TMDC) material over the first work function layer prior to depositing the second work function layer.

15. A method comprising:
patterning a substrate to form a semiconductor structure over the substrate;
forming dielectric structures over the substrate and laterally surrounding a bottom portion of the semiconductor structure;
forming a gate structure over the dielectric structures and the semiconductor structure;
depositing an interlayer dielectric layer over the dielectric structures and laterally surrounding the gate structure;

forming openings in the interlayer dielectric layer to expose the dielectric structures;

forming a reading contact and a sensing contact in the openings;

forming a multilayer interconnection structure over the gate structure, the reading contact, and the sensing contact, wherein the multilayer interconnection structure comprises a sensing electrode electrically connected to the sensing contact;

depositing a first work function layer over the sensing electrode of the multilayer interconnection structure;

depositing a second work function layer over the sensing electrode of the multilayer interconnection structure, wherein a work function value of the second work function layer is greater than a work function value of the first work function layer, and the work function value of the first work function layer is greater than a work function value of the sensing electrode; and

patterning the second work function layer and the first work function layer to form a filter covering the sensing electrode.

16. The method of claim 15, wherein the first work function layer is in contact with a top surface of the sensing electrode.

17. The method of claim 15, wherein a thickness of the sensing electrode is greater than a thickness of the first work function layer.

18. The method of claim 15, further comprising removing an oxide layer over the sensing electrode prior to depositing the first work function layer.

19. The method of claim 15, further comprising performing an implantation process to the first work function layer prior to depositing the second work function layer.

20. The method of claim 15, wherein the gate structure is a floating gate.

* * * * *